(12) United States Patent
Jang et al.

(10) Patent No.: US 11,756,813 B2
(45) Date of Patent: Sep. 12, 2023

(54) SUBSTRATE TREATING APPARATUS

(71) Applicant: SEMES CO., LTD., Cheonan-si (KR)

(72) Inventors: Yong Seok Jang, Cheonan-si (KR); In Kyu Park, Gunpo-si (KR)

(73) Assignee: SEMES CO., LTD., Chungcheongnam-Do (KR)

(*) Notice: Subject to any disclaimer, the term of this patent is extended or adjusted under 35 U.S.C. 154(b) by 0 days.

(21) Appl. No.: 17/476,890

(22) Filed: Sep. 16, 2021

(65) Prior Publication Data
US 2022/0093427 A1 Mar. 24, 2022

(30) Foreign Application Priority Data

Sep. 21, 2020 (KR) .................. 10-2020-0121436

(51) Int. Cl.
| | |
|---|---|
| *H01L 21/677* | (2006.01) |
| *H01L 21/67* | (2006.01) |
| *H01L 21/68* | (2006.01) |
| *H01L 21/673* | (2006.01) |

(52) U.S. Cl.
CPC .. *H01L 21/67201* (2013.01); *H01L 21/67115* (2013.01); *H01L 21/67265* (2013.01); *H01L 21/67389* (2013.01); *H01L 21/67745* (2013.01); *H01L 21/68* (2013.01)

(58) Field of Classification Search
CPC combination set(s) only.
See application file for complete search history.

(56) References Cited

U.S. PATENT DOCUMENTS

| | | | |
|---|---|---|---|
| 2001/0011842 A1 | 8/2001 | Rockl et al. | |
| 2017/0372933 A1* | 12/2017 | Kim | H01L 21/681 |
| 2019/0006218 A1* | 1/2019 | Toyoda | H01L 21/67017 |

FOREIGN PATENT DOCUMENTS

| | | |
|---|---|---|
| JP | 2003-185466 A | 7/2003 |
| KR | 10-2003-0059046 A | 7/2003 |
| KR | 10-2009-0097170 A | 9/2009 |
| KR | 100936085 B1 | 1/2010 |
| KR | 10-2013-0037360 A | 4/2013 |
| KR | 10-2019-0067105 A | 6/2019 |

OTHER PUBLICATIONS

Korean Office Action dated Dec. 21, 2022 issued in Korean Patent Application No. 10-2020-0121436.

* cited by examiner

*Primary Examiner* — Saul Rodriguez
*Assistant Examiner* — Willie W Berry, Jr.
(74) *Attorney, Agent, or Firm* — Harness, Dickey & Pierce, P.L.C.

(57) ABSTRACT

Disclosed is a substrate treating apparatus. The substrate treating apparatus includes an index unit including a load pot, in which a container is seated, and an index chamber connected to the load pot, and a process executing unit having a load lock chamber connected to the index chamber and a process chamber that treats a substrate transferred to the load lock chamber, the index unit further includes an alignment unit provided in the index chamber and that aligns a substrate type sensor transferred to the process chamber.

15 Claims, 14 Drawing Sheets

SUBSTRATE TREATING APPARATUS

CROSS-REFERENCE TO RELATED APPLICATIONS

A claim for priority under 35 U.S.C. § 119 is made to Korean Patent Application No. 10-2020-0121436 filed on Sep. 21, 2020, in the Korean Intellectual Property Office, the entire contents of which are hereby incorporated by reference.

BACKGROUND

Embodiments of the inventive concept described herein relate to a substrate treating apparatus.

Plasma refers to an ionized gaseous state including ions, radicals, and electrons. The plasma is generated by very high temperature, strong electric fields, or radio frequency (RF) electromagnetic fields. A semiconductor device manufacturing process may include an etching process of removing a thin film formed on a substrate, such as a wafer, by using plasma. The etching process is performed as ions and/or radicals contained in plasma collide a thin film on a substrate or react with a thin film.

A substrate treating apparatus using plasma includes a process chamber of a vacuum atmosphere, a support chuck that supports a substrate in the process chamber, and a focusing ring that surrounds an outer periphery of the substrate seated on the support chuck. The focusing ring is installed to distribute plasma with a high uniformity, and is etched together with the substrate with plasma. When the substrate is repeatedly etched, the focusing ring also is etched so that the shape of the focusing ring gradually changes. A direction, in which ions and/or radicals are input to the substrate, is changed according to a change in the shape of the focusing ring and thus the etching characteristics of the substrate is changed. Accordingly, when a specific number or more of substrates are etched or the shape of the focusing ring is changed to deviate from an allowable range, it is necessary to replace the focusing ring.

To replace the focusing ring, a transfer robot carries out the used focusing ring from a process chamber and carries the focusing ring into a ring pod, and thereafter, carries out a new focusing ring from the ring pod and carries the focusing ring into the process chamber. Then, it is important for a transfer robot to properly seat a new focusing ring at a desired location in the process chamber. This is because the treatment of the substrate using plasma cannot be properly performed when the location of the new focusing ring is not proper.

Accordingly, to identify whether the focusing ring is properly seated in the process chamber, a wafer type sensor having a shape that is similar to a substrate that is treated in the process chamber is used. The wafer type sensor has a diameter that is the same as or slightly larger than the substrate that is the to-be-treated object. Accordingly, the wafer type sensor may be transferred by a transfer robot that transfers the substrate that is the to-be-treated object. Furthermore, the wafer type sensor is provided with an image acquiring module (for example, a camera or the like) that may acquire an image in an interior of the process chamber. Accordingly, when the wafer type sensor is carried into the process chamber, the image acquiring module of the wafer type sensor may acquire the image in the interior of the process chamber. Furthermore, a user may identify whether the focusing ring positioned in the process chamber is seated at a desired location, through the image acquired by the wafer type sensor. Furthermore, the wafer type sensor is used for auto teaching of the transfer robot.

In this way, to accurately identify a positioning location of the focusing ring by using the wafer type sensor and precisely perform the auto teaching of the transfer robot, it is important to accurately secure centering of the wafer type sensor. For example, it is important to properly align a location of a notch formed in the wafer type sensor and a location, at which the wafer type sensor is positioned on a transfer hand. To achieve this, generally, a wafer type sensor dedicated container (for example, a wafer type sensor dedicated FOUP) having a structure that aligns a notch of a wafer type sensor or centers the wafer type sensor is used.

However, in this case, the wafer type sensor cannot be aligned after it is carried out from the wafer type sensor dedicated container. Furthermore, it is necessary to separately manufacture a dedicated container having a structure that may align the wafer type sensor. Furthermore, there is a limit in using the dedicated container for substrate treating apparatuses, of which treatment environments and facility structures are different.

SUMMARY

Embodiments of the inventive concept provide a substrate treating apparatus that may efficiently align a substrate type sensor.

Embodiments of the inventive concept also provide a substrate treating apparatus that may effectively acquire an image for an interior of a process chamber.

Embodiments of the inventive concept also provide a substrate treating apparatus that may effectively perform auto teaching for a transfer robot.

The aspect of the inventive concept is not limited thereto, and other unmentioned aspects of the present invention may be clearly appreciated by those skilled in the art from the following descriptions.

The inventive concept provides a substrate treating apparatus. The substrate treating apparatus includes an index unit including a load pot, in which a container is seated, and an index chamber connected to the load pot, and a process executing unit having a load lock chamber connected to the index chamber and a process chamber that treats a substrate transferred to the load lock chamber, the index unit further includes an alignment unit provided in the index chamber and that aligns a substrate type sensor transferred to the process chamber.

According to an embodiment, the alignment unit may include a support member that supports the substrate type sensor, and a sensor member that senses whether a notch formed in the substrate type sensor is aligned.

According to an embodiment, the support member may include a positioning part that moves the substrate type sensor supported by the support member in a first direction and/or a second direction that is perpendicular to the first direction when viewed from a top, a support plate having a support surface that supports the substrate type sensor, and a rotary shaft that rotates the support plate.

According to an embodiment, the support plate may have a suction hole that vacuum-suctions the substrate type sensor supported by the support surface.

According to an embodiment, the alignment unit may further include a pressure reducing member that reduces a pressure in the suction hole.

According to an embodiment, the sensor member may include an irradiation part that irradiates light, and a light receiving part that receives the light irradiated by the irradiation part.

According to an embodiment, the index unit may further include a first transfer robot provided in the index chamber and that carries out the substrate type sensor from the container.

According to an embodiment, the substrate treating apparatus may further include a controller, and the controller may be configured to carry out the substrate type sensor from the container and seat the substrate type sensor on the support plate, and control the first transfer robot and the alignment unit to align the substrate type sensor by changing a location of the support plate and/or rotating the support plate.

According to an embodiment, the controller may be configured to, when the alignment unit has completely aligned the substrate type sensor, control the first transfer robot to transfer the substrate type sensor to the load lock chamber.

According to an embodiment, the controller may be configured to, when it is determined that it is impossible for the alignment unit to align the substrate type sensor, control the first transfer robot to transfer the substrate type sensor seated on the support plate to the container.

According to an embodiment, the controller may be configured to, when a gas flows in a pressure reducing line connected to the suction hole for a preset period of time or more, determine that it is impossible for the alignment unit to align the substrate type sensor.

According to an embodiment, the controller may be configured to, when the sensor member does not sense the notch even though the substrate type sensor is rotated by a preset angle or more, determine that it is impossible for the alignment unit to align the substrate type sensor.

The inventive concept provides a substrate treating apparatus. The substrate treating apparatus includes a process chamber having a treatment space for treating a substrate, an index chamber connected to a load pot, in which a container in which a substrate type sensor that acquires an image of the treatment space is received is seated, and that maintains an interior atmosphere at an atmospheric atmosphere, at least one transfer robot that transfers the substrate or the substrate type sensor between the index chamber and the process chamber, and an alignment unit provided in the index chamber and that aligns the substrate type sensor.

According to an embodiment, the substrate treating apparatus may further include a controller, and the controller may be configured to carry out the substrate type sensor from the container and transfer the substrate type sensor to the alignment unit, and control the transfer robot and the alignment unit such that the alignment unit aligns a location of a notch formed in the substrate type sensor.

According to an embodiment, the controller may be configured to, when the alignment unit has completely aligned the location of the notch, control the transfer robot to transfer the substrate type sensor to the process chamber.

According to an embodiment, the controller may be configured to, when it is determined that it is impossible for the alignment unit to align the location of the notch, control the transfer robot to transfer the substrate type sensor to the container.

According to an embodiment, the controller may be configured to, when a gas flows in a pressure reducing line connected to a suction hole included in the alignment unit and that vacuum-suctions the substrate type sensor for a preset period of time or more, determine that it is impossible for the alignment unit to align the location of the notch.

According to an embodiment, the controller may be configured to, when a sensor member included in the alignment unit and that senses the notch does not sense the notch even through the alignment unit rotates the substrate type sensor by a preset angle or more, determine that it is impossible for the alignment unit to align the location of the notch.

The inventive concept provides a substrate treating apparatus. The substrate treating apparatus includes an index unit including a load pot, in which a container in which a substrate, and a substrate type sensor having an image acquiring module are received is seated, a process executing unit having a process chamber that treats the substrate, and a controller, and the index unit includes an index chamber connected to the load pot and maintained at an atmospheric atmosphere, an alignment unit provided in the index chamber and that aligns the substrate type sensor, and a first transfer robot that transfers the substrate or the substrate type sensor between the index chamber and the process executing unit, the process executing unit includes a load lock chamber that contacts the index chamber and an internal atmosphere of which is converted between a vacuum pressure atmosphere and the atmospheric atmosphere, a transfer chamber that contacts the load pot and an internal atmosphere of which is maintained in the vacuum pressure atmosphere, and a second transfer robot provided in the transfer chamber, and that transfers the substrate carried into the load pot or the substrate type sensor to the process chamber, and the alignment unit includes a support plate having a support surface that supports the substrate type sensor, and having a suction hole for vacuum-absorbing the substrate type sensor supported on the support surface, a rotary shaft that rotates the support plate, a positioning part that moves the substrate type sensor supported by the support plate in a first direction and/or a second direction that is perpendicular to the first direction when viewed from a top, an irradiation part that irradiates light, and a sensor member that receives the light irradiated by the irradiation part and sense a notch formed in the substrate type sensor.

According to an embodiment, the controller may be configured to control the first transfer robot to carry out the substrate type sensor from the container and seat the substrate type sensor on the support plate, control the alignment unit to align the substrate type sensor by changing a location of the support plate and/or rotating the support plate, when the alignment unit has completely aligned the substrate type sensor, control the first transfer robot to transfer the substrate type sensor to the load lock chamber, and when it is determined that it is impossible for the alignment unit to align the substrate type sensor, control the first transfer robot to transfer the substrate type sensor seated on the support plate to the container, and the controller may be configured to, when a gas flows in a pressure reducing line connected to the suction hole for a preset period of time or more or the sensor member does not sense the notch even though the substrate type sensor is rotated by a preset angle or more, determine that it is impossible for the alignment unit to align the substrate type sensor.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
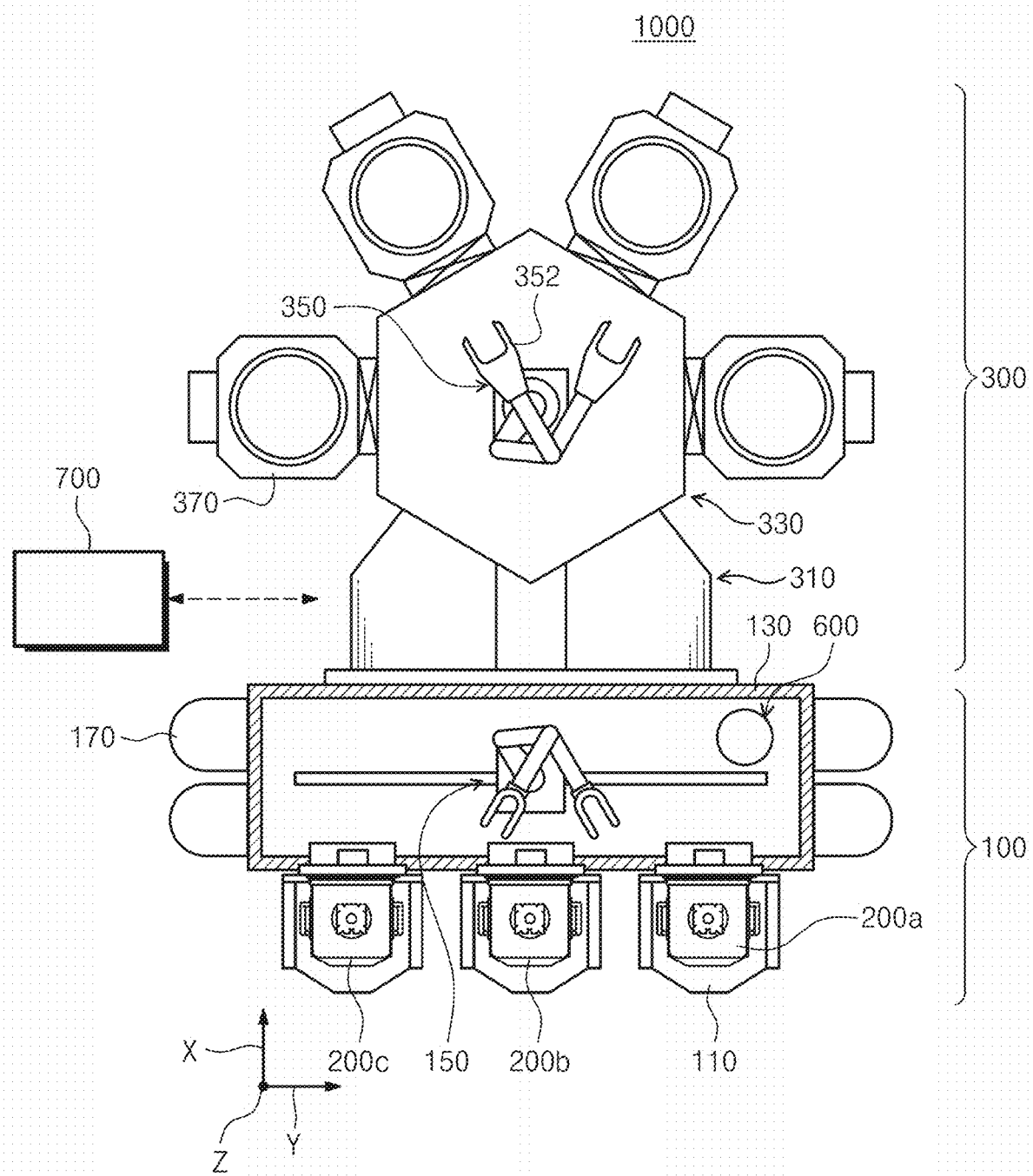
FIG. 1 is a plan view schematically illustrating a substrate treating apparatus according to an embodiment of the inventive concept.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the inventive concept, a first element may be named a second element, and similarly, the second element may be named the first element.

When it is mentioned that one element is "connected to" or "electrically connected to" another element, it should be understood that the first element may be directly connected or electrically connected to the second element but a third element may be provided therebetweeen. On the other hand, when it is mentioned that an element is "directly connected to" or "directly electrically connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the inventive concept will be described with reference to FIGS. 1 to 15.

FIG. 1 is a plan view schematically illustrating a substrate treating apparatus according to an embodiment of the inventive concept. Referring to FIG. 1, a substrate treating apparatus 1000 according to an embodiment of the inventive concept may include an index unit 100, a process executing unit 300, and a controller 700. The index unit 100 and the process executing unit 300 may be arranged along a first direction "X" when viewed from a top. Hereinafter, a direction that is perpendicular to the first direction "X" when viewed from the top is defined as a second direction "Y". Furthermore, a direction that is perpendicular to the first direction "X" and the second direction "Y" is defined as a third direction "Z". Here, the third direction "Z" may refer to a direction that is perpendicular to a ground surface.

The index unit 100 may include a load pot 110, an index chamber 130, a first transfer robot 150, a side buffer 170, and an alignment unit 600.

Containers 200*a*, 200*b*, and 200*c* may be seated in the load pot 110. Various kinds of containers 200*a*, 200*b*, and 200*c* may be seated in the load pot 110. For example, various kinds of containers 200*a*, 200*b*, and 200*c* that receive different articles may be seated in the load pot 110. For example, a ring member "R" transferred to a process chamber 370, which will be described below, and/or a carrier "C" used to transfer the ring member "R" may be received in, among the containers 200*a*, 200*b*, and 200*c*, the first container 200*a*. Furthermore, a substrate type sensor WS, which will be described below, may be received in the second container 200*b*. Furthermore, a substrate "W" (for example, a wafer) that is a to-be-treated object that is treated in the process chamber 370 may be received in the third container 200*c*.

However, the inventive concept is not limited thereto, but at least any one of the ring member "R", the carrier "C", the substrate type sensor WS, and the substrate "W" may be received in the first container 200a. Similarly, at least any one of the ring member "R", the carrier "C", the substrate type sensor WS, and the substrate "W" also may be received in the second container 200b and the third container 200c.

The containers 200a, 200b, and 200c may be transferred to the load pot 110 by a container transfer apparatus to be loaded in the load pot 110 or unloaded from the load pot 110, and may be transferred. The container transfer apparatus may be an overhead transport apparatus (hereinafter, an OHT), but the inventive concept is not limited thereto and the containers 200a, 200b, and 200c may be transferred by various apparatuses that transfer the containers 200a, 200b, and 200c. Furthermore, an operator may directly load the containers 200a, 200b, and 200c in the load pot 110 or unload the containers 200a, 200b, and 200c seated in the load pot 110 from the load pot 110.

Figure 2:
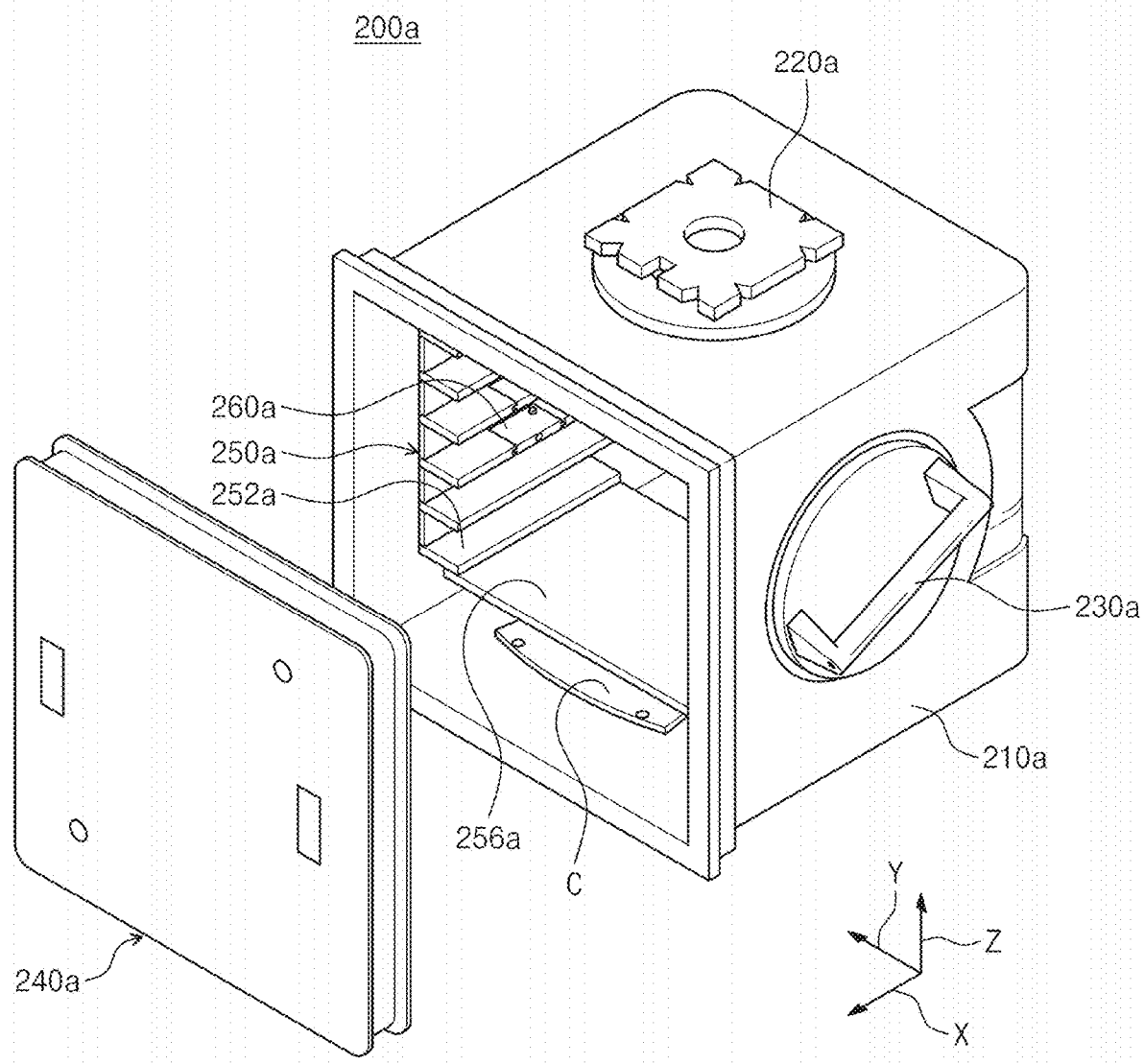
FIG. 2 is a view illustrating a first container of FIG. 1.

FIG. 2 is a view illustrating a first container of FIG. 1. Referring to FIG. 2, the first container 200a may include a housing 210a, a flange 220a, a grip part 230a, a door 240a, a support part 250a, and a carrier support structure 270a.

The housing 210a may have an interior space. At least one of the ring member "R" and the carrier "C" may be received in the interior space of the housing 210a. The flange 220a may be installed on an upper surface of the housing 210a. The flange 220a may be gripped by a gripper of a container transfer apparatus, for example, an overhead transfer (OHT) apparatus.

Furthermore, the grip part 230a may be installed on a side surface of the housing 210a. The grip parts 230a may be installed on opposite side surfaces of the housing 210a. The grip part 230a may be a handle that allows the operator to grip the first container 200a. Accordingly, an operator may grip the grip part 230a to directly seat the first container 200a in the load pot 110 or separate the first container 200a from the load pot 110.

Figure 3:
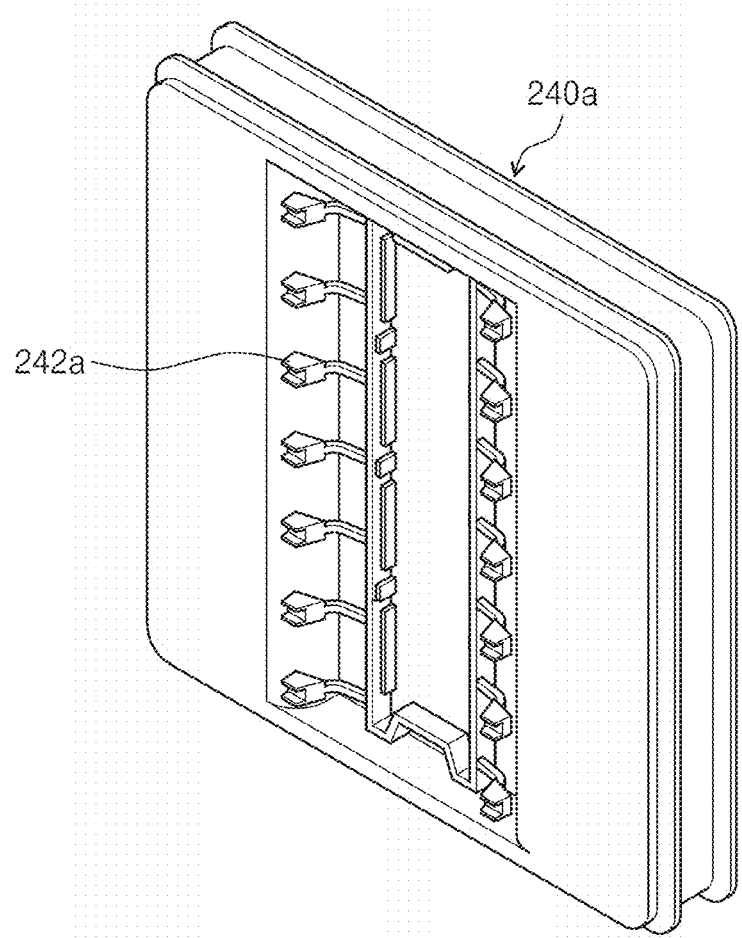
FIG. 3 is a view illustrating a door of FIG. 2.

The door 240a may selectively open and close the interior space of the housing 210a. The door 240a may be combined with the housing 210a to form the interior space. The door 240a may be docked with a front surface of the housing 210a or undocked from the front surface of the housing 210a. One surface of the door 240a, which faces the interior space of the housing 210a, as illustrated in FIG. 3, may be provided with a retainer 242a that clamps the ring member "R" received in the interior space. The retainer 242a may have a structure that extends along an upward/downward direction. The retainer 242a may clamp a side of the ring member "R" received in the interior space, and may restrict a change of a location of the ring member "R" received in the interior space.

Referring to FIG. 2 again, the support part 250a may be provided in the interior space of the housing 210a. The support part 250a may support the ring member "R" in the interior space of the housing 210a. The support part 250a may include a support slot 252a, a separation plate 256a, and an alignment block 260a.

The support slot 252a may support the ring member "R". The support slot 252a may support a bottom surface of an edge area of the ring member "R". For example, the support slot 252a may support at least a portion of the bottom surface of the edge area of the ring member "R". Furthermore, the support slot 252a may support one side and an opposite side of the bottom surface of the edge area of the ring member "R".

At least one support slot 252a may be provided. For example, a plurality of support slots 252a may be provided. Furthermore, the support slots 252a may be arranged along the third direction Z" that is the upward/downward direction. Accordingly, the ring member "R" supported by the support slots 252a may be received in the interior space of the housing 210a along the upward/downward direction.

The separation plate 256a may partition the interior space of the housing 210a. For example, the separation plate 256a may separate the interior space of the housing 210a into a space, in which the carrier "C" is received, and a space, in which the ring member "R" is received. The separation plate 256a may be coupled to, among the support slots 252a, a support slot 252a installed on the lowermost side. For example, the separation plate 256a may be coupled to a lower surface of, among the support slots 252a, the support slot 252a installed on the lowermost side. The separation plate 256a may separate the interior space of the housing 210a into the space, in which the carrier "C" is received, and the space, in which the ring member "R" is received, to minimize a danger of the carrier "C" and the hand of the first transfer robot 150 colliding with each other when the hand of the first transfer robot 150 is carried into the interior space of the housing 210a. Furthermore, the separation plate 256a may minimize impurities attached to the ring member "R" from being delivered to the carrier "C" when the used ring member "R" is carried into the interior space of the housing 210a.

Figure 4:
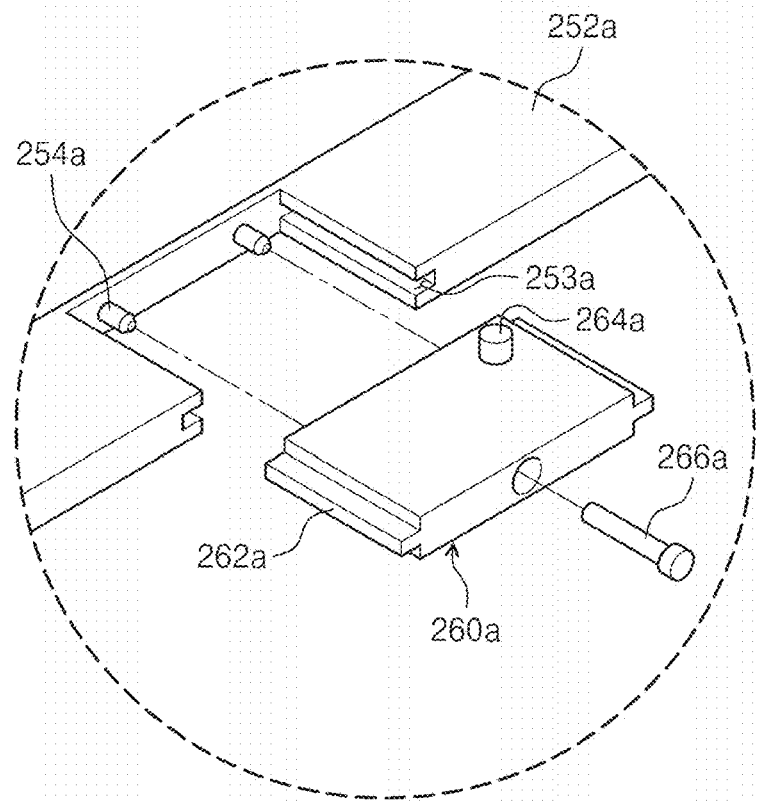
FIG. 4 is a view illustrating an example of a support slot and an alignment block of FIG. 2.

FIG. 4 is a view illustrating an example of a support slot and an alignment block of FIG. 2. Referring to FIG. 4, the alignment block 260a may be installed in the support slot 252a to be detachable. The alignment block 260a may be inserted into the support slot 252a. The alignment block 260a inserted into the support slot 252a may be fixedly coupled to a coupling unit 266a.

At least one of the surfaces of the alignment block 260a, which contacts the support slot 252a, may be provided with a protrusion 262a that guides insertion of the alignment block 260a. For example, the protrusions 262a may be formed on left and right surfaces of the alignment block 260a with respect to a direction, in which the alignment block 260a is inserted. Furthermore, at least one of the surfaces of the support slot 252a, which contacts the alignment block 260a, may be provided with a guide groove 253a having a shape corresponding to the protrusion 262a. For example, the guide groove 253a may be formed at a location corresponding to the protrusion 262a of the alignment block 260a, which is inserted into the support slot 252a.

Furthermore, it has been described as an example that the protrusion 262a is formed in the alignment block 260a and the guide groove 253a is formed in the support slot 252a, but the inventive concept is not limited thereto and, unlike this, the guide groove may be formed in the alignment block 260a and the protrusion may be formed in the support slot 252a.

Furthermore, the support part 250a may include at least one guide pin 254a that guide a location of the alignment block 260a inserted into the support slot 252a. For example, the guide pin 254a may be provided at least one of the surfaces of the support slot 252a, which contacts the alignment block 260a. The guide pin 254a may be inserted into a hole (not illustrated) formed in the alignment block 260a. For example, the hole, into which the guide pin 254a is inserted, may be formed on a front surface of the alignment block 260a with respect to the direction, in which the alignment block 260a is inserted into the support slot 252a. Further, the guide pin 254a may be provided at a location corresponding to the hole formed in the alignment block 260a. The guide groove 253a, the guide pin 254a, the protrusion 262a, and the hole (not illustrated) may help the alignment block 260a be appropriately inserted into the support slot 252a, and may prevent the location of the inserted alignment block 260a from being changed and the alignment block 260a from being loosened from the support slot 252a.

The alignment block 260a may be provided with an alignment pin 264a. The alignment pin 264a may be provided on an upper surface of the alignment block 260a. Accordingly, when the alignment block 260a is inserted into the support slot 252a, the support slot 252a may align the location of the supported ring member "R".

Figure 5:
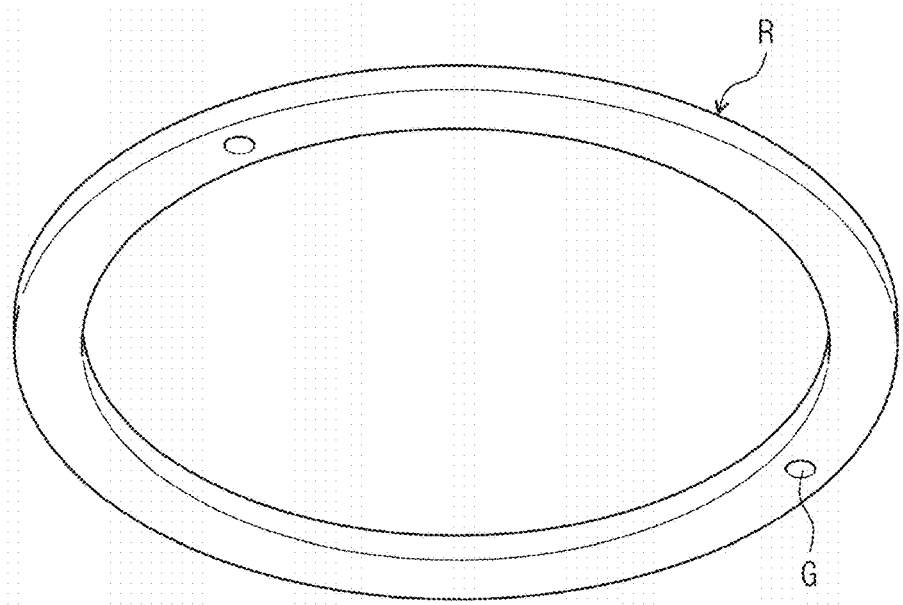
FIG. 5 is a view illustrating a ring member seated on a support part of FIG. 2.

FIG. 5 is a view illustrating a ring member seated on a support part of FIG. 2. Referring to FIG. 5, the ring member "R" may have a ring shape. The ring member "R" may be a process kit provided in the process chamber 370. The ring member "R" may be a ring member provided in the process chamber 370. For example, the ring member "R" may be an ISO ring or a focusing ring. An alignment groove "G" may be formed on a lower surface of the ring member "R". A plurality of alignment grooves "G" may be formed on a lower surface of the ring member "R". The alignment pin 264a provided in the alignment block 260a may be inserted into the alignment groove "G" to align the location of the ring member "R".

That is, the alignment pin 264a according to the embodiment of the inventive concept may be inserted into the align groove "G" formed in the ring member "R" received in the first container 200a to align the ring member "R". Accordingly, even when the skill of the operator is rather low, the ring member "R" may be aligned at a proper location even only by causing the locations of the alignment groove "G" of the ring member "R" and the alignment pin 264a to coincide with each other when the ring member "R" is seated in the first container 200a. Accordingly, a problem, in which the ring member "R" is not aligned in the first container 200a, and thus the ring member "R" transferred to the process chamber 370 may not be appropriately seated at a proper location in the process chamber 370, may be solved. Furthermore, the alignment pin 264a may be inserted into the alignment groove "G" formed in the ring member "R" to restrict a change in the location of the ring member "R" when the first container 200a is transferred. Accordingly, a problem, in which the location of the ring member "R" is changed and thus the ring member "R" may not be appropriately seated at a proper location in the process chamber 370 in a process of transferring the first container 200a, may be solved.

Figure 6:
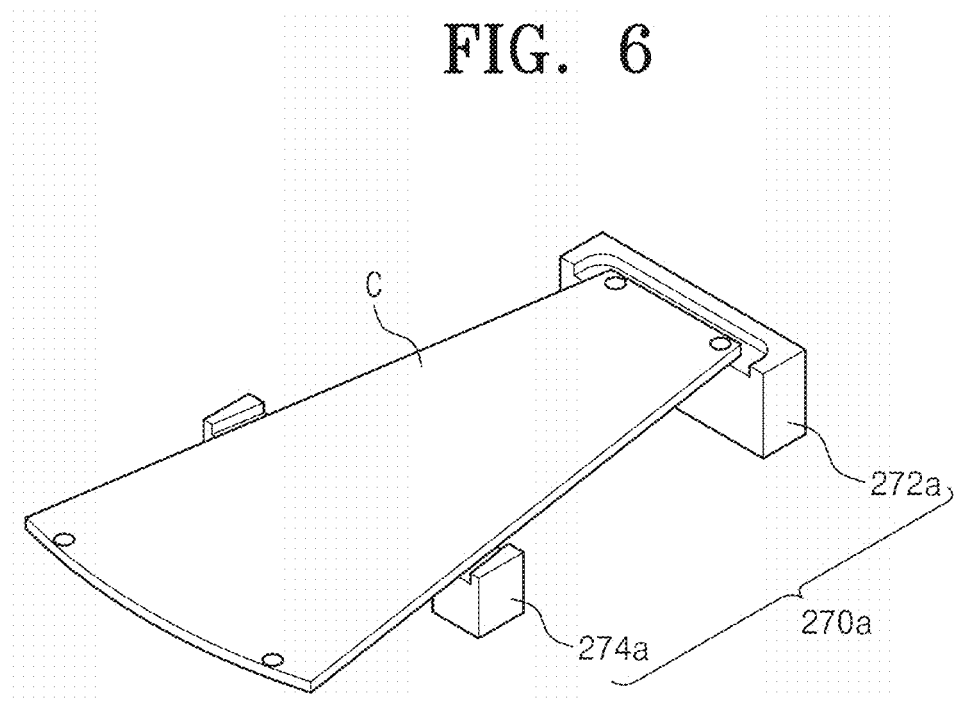
FIG. 6 is a view illustrating a state of a carrier seated in a container, and a carrier support structure that supports the carrier.

FIG. 6 is a view illustrating a state of a carrier seated in a container, and a carrier support structure that supports the carrier. Referring to FIG. 6, the carrier "C" may be used to transfer the ring member "R". The carrier "C" may have a substantially ladder shape when viewed from the top, and any one of the surfaces of the carrier "C" may be rounded. The carrier "C" may be stored in the interior space of the first container 200a by the carrier support structure 270a. Further, the carrier "C" may be retrieved by the first transfer robot 150 having the hand.

The carrier support structure 270a may support the carrier "C". The carrier support structure 270a may support the carrier "C" in the interior space of the housing 210a. The carrier support structure 270a may be disposed below the support part 250a. The carrier support structure 270a may be installed in an interior space corresponding to the lower one of the interior spaces partitioned by the separation plate 256a. The carrier support structure 270a may include a first support structure 272a and a second support structure 274a. A pair of second support structures 274a may be provided. The first support structure 272a, and the pair of second support structures 274a may support a lower surface of the carrier "C" at three points.

The substrate treating apparatus 1000 according to the embodiment of the inventive concept may transfer the unused ring member "R" received in the first container 200a to the process chamber 370 by using the first transfer robot 150 and a second transfer robot 350, which will be described below. Furthermore, the substrate treating apparatus 1000 according to the embodiment of the inventive concept may transfer the ring member "R" used in the process chamber 370 to the first container 200a by using the first transfer robot 150 and the second transfer robot 350, which will be described below. That is, the substrate treating apparatus 1000 may automatically replace the ring member "R".

Figure 7:
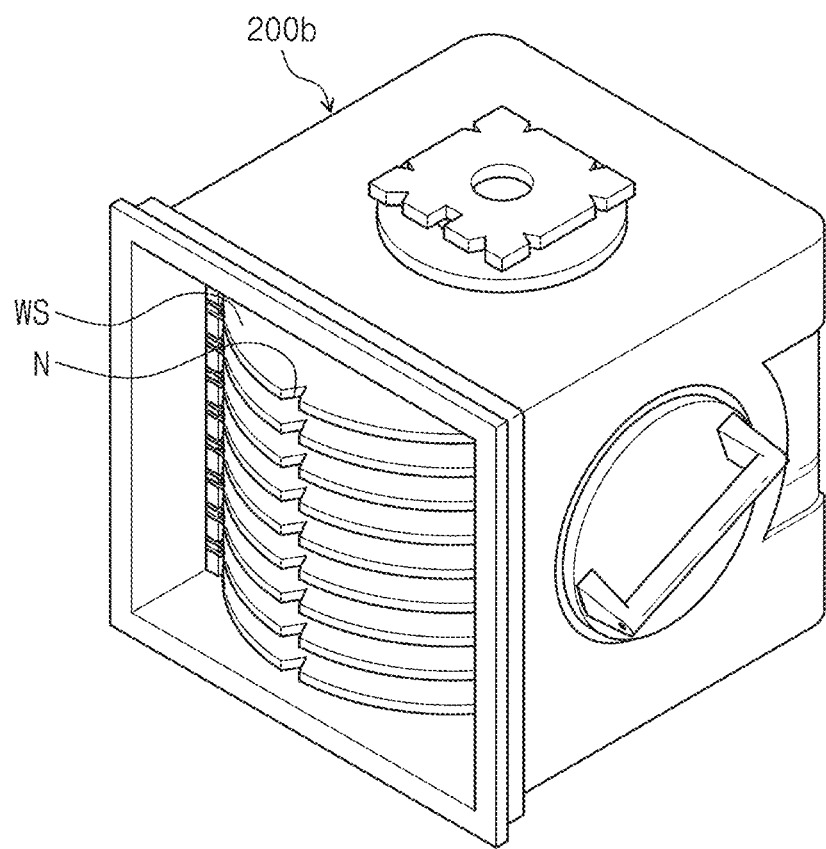
FIG. 7 is a view illustrating a second container of FIG. 1.

FIG. 7 is a view illustrating a second container of FIG. 1. Referring to FIG. 7, the substrate type sensor WS may be received in the second container 200b according to the embodiment of the inventive concept. The substrate type sensor WS may be a wafer type sensor. The substrate type sensor WS may have an image acquiring module that is transferred to a process chamber 510, which will be described below, to acquire an image of a treatment space included in the process chamber 510. Furthermore, the substrate type sensor WS may have a notch "N" that is used when centering of the substrate type sensor WS is secured.

The substrate treating apparatus 1000 according to the embodiment of the inventive concept may transfer the substrate type sensor WS received in the second container 200b to the process chamber 370 by using the first transfer robot 150 and the second transfer robot 350, which will be described below. Furthermore, the substrate treating apparatus 1000 according to the embodiment of the inventive concept may transfer the substrate type sensor WS that has performed measurement in the process chamber 370 to the second container 200b by using the first transfer robot 150 and the second transfer robot 350, which will be described below.

The index chamber 130 may be provided between the load pot 110 and the process executing unit 300. That is, the load pot 110 may be connected to the index chamber 130. The index chamber 130 may be maintained in an atmospheric atmosphere. The side buffer 170 that is a keeping site may be installed on one side of the index chamber 130. Furthermore, the alignment unit 600 that aligns the substrate type sensor WS transferred to the process chamber 510, which will be described below, may be provided into the index chamber 130. The alignment unit 600 will be described in detail below.

Furthermore, the first transfer robot 150 may be provided in the index chamber 130. The first transfer robot 150 may transfer the substrate "W", the substrate type sensor WS, and the ring member "R" between the containers 200a, 200b, and 200c seated in the load pot 110, the alignment unit 600, a load lock chamber 310, which will be described below, and the side buffer 170. That is, the first transfer robot 150 may carry out the substrate type sensor WS from the second container 200b.

The process executing unit 300 may include the load lock chamber 310, a transfer chamber 330, the second transfer robot 350, and the process chamber 370.

The load lock chamber 310 may be disposed between the transfer chamber 330 and the index chamber 130. That is, the load lock chamber 310 may be connected to the index chamber 130 and the transfer chamber 330. The load lock chamber 310 provides a space, in which the substrate "W" and/or the ring member "R" are temporarily stored. A vacuum pump (not illustrated) and a valve may be installed in the load lock chamber 310 such that an internal atmosphere of the load lock chamber 310 may be converted between an atmospheric atmosphere and a vacuum atmosphere. Because the internal atmosphere of the transfer chamber 330, which will be described below, is maintained in the vacuum atmosphere, the atmosphere of the load lock chamber 310 may be converted between the atmospheric atmosphere and the vacuum atmosphere to transfer the substrate and the ring member "R" between the transfer chamber 330 and the index chamber 130.

The transfer chamber 330 may be disposed between the load lock chamber 310 and the process chamber 370. As described above, the internal atmosphere of the transfer chamber 330 may be maintained in the vacuum atmosphere. Furthermore, the second transfer robot 350 may be provided in the transfer chamber 330. The second transfer robot 350 may transfer the substrate "W" and the ring member "R" between the load lock chamber 310 and the process chamber 370. The second transfer robot 350 may transfer the substrate "W" or the ring member "R" between the treatment space of the process chamber 370 and the transfer chamber 330. The second transfer robot 350 includes a hand 352. The second transfer robot 350 may be configured to move in the first direction "X", the second direction "Y", and the third direction "Z". Furthermore, the second transfer robot 350 may be configured to the hand 352 about the third direction "Z".

At least one process chamber 370 may be connected to the transfer chamber 330. The process chamber 370 may receive the substrate "W" from the second transfer robot 350 provided in the transfer chamber 330 and may perform a treatment process. The process chamber 370 may be a chamber that performs a process on the substrate "W". The process chamber 370 may be a liquid treating chamber that treats the substrate "W" by supplying a treatment liquid to the substrate "W". Furthermore, the process chamber 370 may be a plasma chamber that treats the substrate "W" by using plasma. Furthermore, some of the process chambers 370 may be liquid treatment chambers that treat the substrate "W" by supplying a treatment liquid to the substrate, and some of the process chambers 370 may be plasma chambers that treat the substrate "W" by using plasma. However, the inventive concept is not limited thereto, and a substrate treating process performed in the process chamber 370 may be variously modified to known substrate treating processes. Furthermore, when the process chamber 370 is a plasma chamber that treats the substrate "W" by using the plasma, the plasma chamber may be a chamber that performs an etching or ashing process of removing a thin film on the substrate "W" by using the plasma. However, the inventive concept is not limited thereto, and a plasma treatment process performed in the process chamber 370 may be variously modified to known plasma treatment processes. A detailed structure of the process chamber 370 will be described below.

Furthermore, FIG. 1 illustrates as an example that the transfer chamber 330 has a substantially hexagonal shape when viewed from the top, and four process chambers 370 connected to the transfer chamber 330 are provided, but the inventive concept is not limited thereto. For example, the shape of the transfer chamber 330 and the number of the process chambers 370 may be variously modified according to the necessity of the user, and the number of substrates that requires a treatment.

The controller 700 may control the substrate treating apparatus 1000. The controller 700 may control the index unit 100 and the process executing unit 300. The controller 700 may control the first transfer robot 150, the second transfer robot 350, and the alignment unit 600. The controller 700 may control the substrate treating apparatus provided in the process chamber 370 such that the substrate "W" may be treated in the process chamber 370 by using the plasma.

Furthermore, the controller 700 may include a process controller including a microprocessor (computer) that executes control of the substrate treating apparatus 1000, a keyboard for inputting commands to allow an operator to manage the substrate treating apparatus 1000, a user interface including a display that visualizes and displays an operation situation of the substrate treating apparatus 1000, and a memory unit for storing a control program for executing processing executed by the substrate treating apparatus 1000 under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

Figure 8:
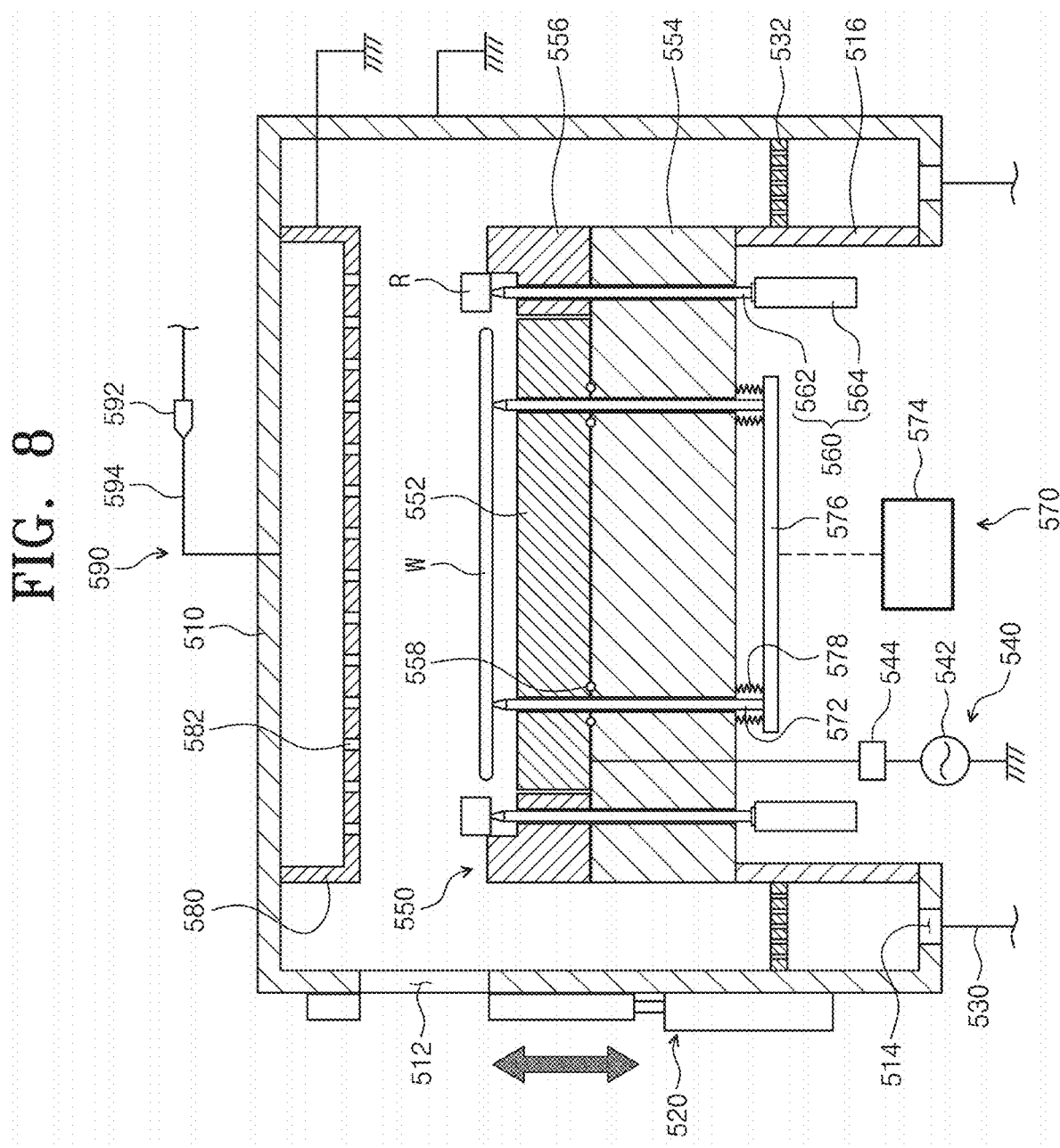
FIG. 8 is a view illustrating the substrate treating apparatus provided in the process chamber of FIG. 1.

FIG. 8 is a view illustrating the substrate treating apparatus provided in the process chamber of FIG. 1. Referring to FIG. 8, a substrate treating apparatus 500 provided in the process chamber 370 will be described in detail. The substrate treating apparatus 500 may treat the substrate "W" by transferring plasma to the substrate "W".

The substrate treating apparatus 500 may include the process chamber 510, a gate valve 520, an exhaust line 530, a power source unit 540, a support unit 550, a ring lift module 560, a substrate lift module 570, a baffle plate 580, and a gas supply unit 590.

The process chamber 510 may have a treatment space. The process chamber 510 may be grounded. The process chamber 510 may provide the treatment space, in which the substrate "W" is treated. The treatment space of the process chamber 510 may be maintained substantially at a vacuum atmosphere when the substrate "W" is treated. An entrance 512, through which the substrate "W" or the ring member "R" is carried in and out, may be formed on one side of the process chamber 510. The gate valve 520 may selectively open and close the entrance 512.

An exhaust hole 514 may be formed on a bottom surface of the process chamber 510. The exhaust line 530 may be connected to the exhaust hole 514. The exhaust line 530 may exhaust a process gas supplied to the treatment space of the process chamber 510, a process by-product, and the like to an outside of the process chamber 510 through the exhaust hole 514. Furthermore, an exhaust plate 532 that makes it possible to exhaust the treatment space more uniformly may be provided at an upper portion of the exhaust hole 514. The exhaust plate 532 may substantially have a ring shape when viewed from the top. Furthermore, at least one exhaust hole may be formed in the exhaust plate 532. The operator may select, among a plurality of exhaust plates 532 having various shapes and sizes, the exhaust plate 532 that may uniformly exhaust the treatment space and install the exhaust plate 532 at an upper portion of the exhaust hole 514.

Furthermore, the process chamber 510 may further include a support member 516. The support member 516 may support at least a portion of a base included in the support unit 550, which will be described below. For example, the support member 516 may be configured to support a lower portion of an insulation plate 554 included in the support unit 550.

The power source unit 540 may generate RF power that excites the process gas supplied by the gas supply unit 590, which will be described below, in a plasma state. The power source unit 540 may include a power source 542 and a matcher 544. The power supply 542 and the matcher 544 may be installed on an electric power transmission line. Furthermore, the electric power transmission line may be connected to a chuck 552.

The support unit 550 may support the substrate "W" in the treatment space of the process chamber 510. The support unit 550 may include the chuck 552, the insulation plate 554, a quartz ring 556, and a sealing member 558.

The chuck 552 may have a support surface that supports the substrate "W". The chuck 552 may support the substrate "W", and may chuck the supported substrate "W". For example, an electrostatic plate (not illustrated) may be provided in the chuck 552, and the chuck 552 may be an electrostatic chuck that chucks the substrate "W" by using an electrostatic force. For example, the chuck 552 may be an electrode static chuck (ESC). However, the inventive concept is not limited thereto, and the chuck 552 may chuck the substrate "W" in a vacuum suction scheme.

The insulation plate 554 may have a circular shape when viewed from a top. The above-described chuck 552, and the quartz ring 556, which will be described below, may be positioned on the insulation plate 554. The insulation plate 554 may be a dielectric body. For example, the insulation plate 554 may be formed of a material including ceramics.

The quartz ring 556 may be formed of a material including quartz. The quartz ring 556 may substantially have a ring shape when viewed from the top. The quartz ring 556 may substantially have a shape that surrounds the chuck 552 when viewed from the top. The quartz ring 556 may have a shape that surrounds the substrate "W" supported by the chuck 552 when viewed from the top.

Furthermore, the quartz ring 556 may have a stepped shape such that a height of an upper surface of an inner side thereof and a height of an upper surface of an outer side thereof may be different. For example, the height of the upper surface of the inner side of the quartz ring 556 may be lower than the height of the upper surface of the outer side thereof. Furthermore, the ring member "R" (for example, a focusing ring) may be positioned on the upper surface of the inner side of the quartz ring 556.

The sealing member 558 may be provided between the insulation plate 554 and the chuck 552 to prevent an arc from being generated in a gap between pin holes formed the insulation plate 554 and the chuck 552, which will be described below.

The ring lift module 560 may elevate the ring member "R" positioned on the upper surface of the inner side of the quartz ring 556. The ring lift module 560 may include a ring lift pin 562 and a ring lift pin elevating part 564. The ring lift pin 562 may be moved upwards and downwards along the pin holes formed in the insulation plate 554 and/or the quartz ring 556. Furthermore, the ring lift pin 562 may be moved upwards and downwards by the ring lift pin elevating part 564 that elevates the ring lift pin 562. The ring lift pin elevating plate 564 may be a cylinder that uses a pneumatic pressure or a hydraulic pressure, or a motor.

The substrate lift module 570 may elevate the substrate "W" positioned on the chuck 552. The substrate lift module 570 may include a substrate lift pin 572, a substrate lift pin elevating part 574, an elevation plate 576, and a bellows 578. The substrate lift pin 572 may be moved upwards and downwards along the pin holes formed in the insulation plate 554 and/or the chuck 552. The substrate lift pin 572 may be coupled to the elevation plate 576 that has received power from the substrate lift pin elevating part 574, and may be moved upwards and downwards through elevation of the elevation plate 576. Furthermore, the bellows 578 that may maintain an airtightness may be installed at a connection portion of the elevation plate 576 and the substrate lift pin 572.

The baffle plate 580 may be provided at an upper portion of the support unit 550. The baffle plate 580 may be formed of an electrode material. At least one baffle hole 582 may be formed in the baffle plate 580. For example, a plurality of baffle holes 582 may be formed, and may be uniformly formed in a whole area of the baffle plate 580 when viewed from the top. The baffle plate 580 makes it possible to uniformly deliver the process gas supplied by the gas supply unit 590, which will be described below, to the substrate "W".

The gas supply unit 590 may supply the process gas into the treatment space of the process chamber 510. The process gas may be a gas that is excited into a plasma state by the power source unit 540, which is described above. The gas supply unit 590 may include a gas supply source 592 and a gas supply line 594. One end of the gas supply line 594 may be connected to the gas supply source 592, and an opposite end of the gas supply line 594 may be connected to an upper portion of the process chamber 510. Accordingly, the process gas delivered by the gas supply source 592 may be supplied to an upper area of the baffle plate 580 through the gas supply line 594. The process gas supplied to the upper area of the baffle plate 580 may be introduced into the treatment space of the process chamber 510 through the baffle hole 582.

Figure 9:
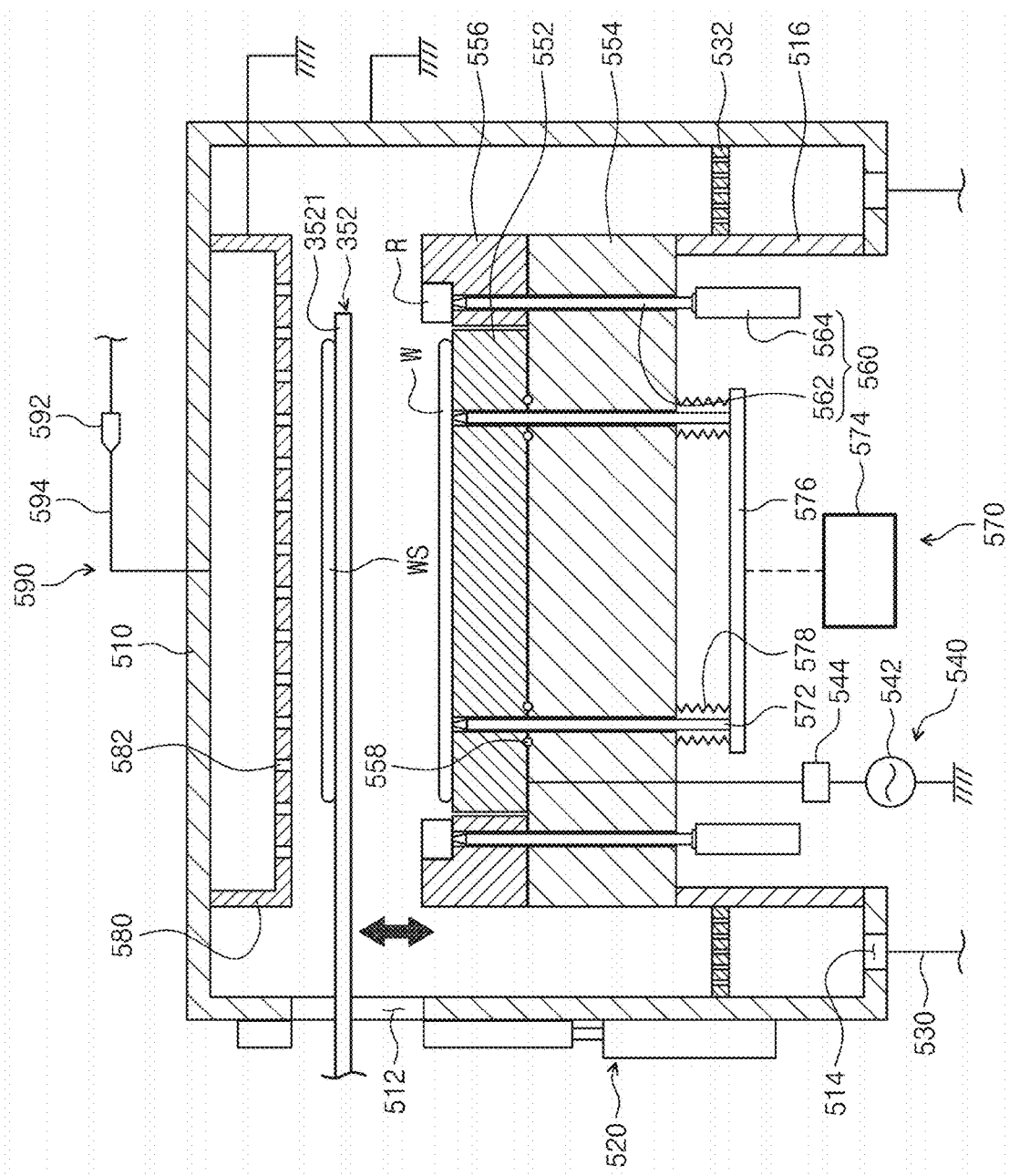
FIG. 9 is a view illustrating a state, in which a substrate type sensor enters a treatment space of FIG. 8.
Figure 10:
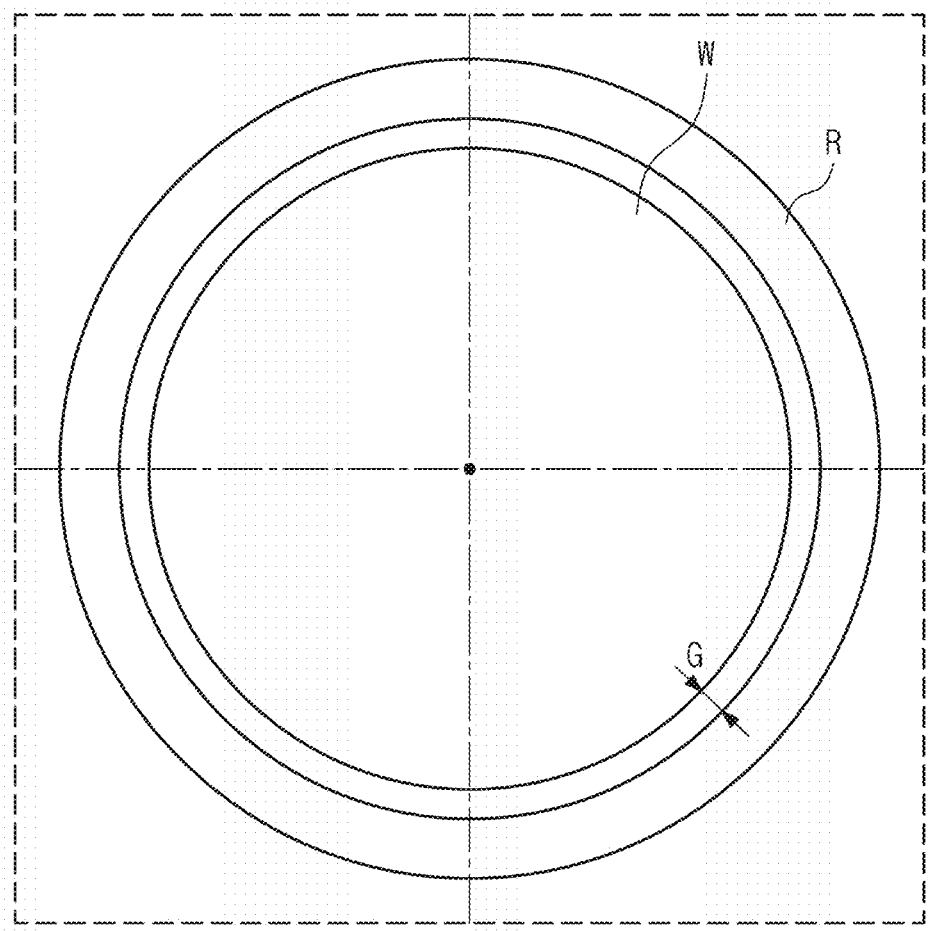
FIG. 10 is a view illustrating an example of an internal image of a treatment space, which is acquired by a substrate type sensor of the inventive concept.
Figure 11:
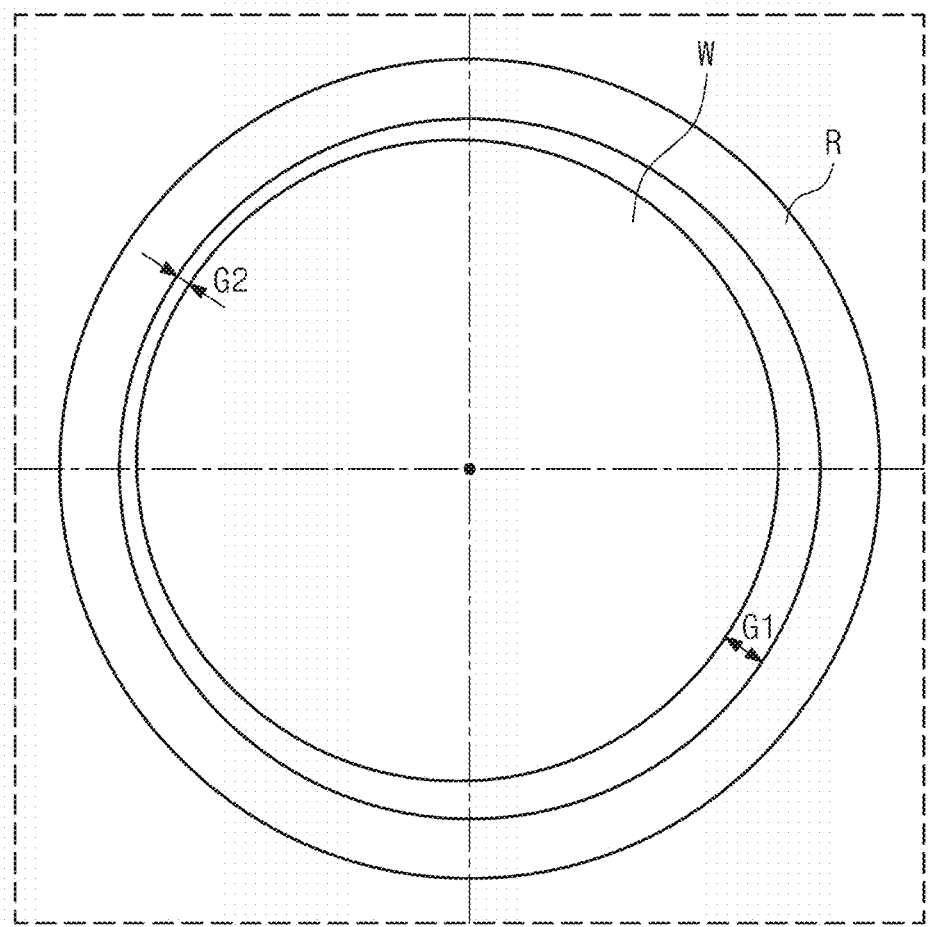
FIG. 11 is a view illustrating another example of an internal image of a treatment space, which is acquired by a substrate type sensor of the inventive concept.

FIG. 9 is a view illustrating a state, in which a substrate type sensor enters a treatment space of FIG. 8. Referring to FIG. 9, the hand 352 included in the second transfer robot 350 according to the embodiment of the inventive concept may enter the treatment space of the process chamber 510 while supporting the substrate type sensor WS. As described above, as the substrate type sensor WS has the image acquiring module, the image of the treatment space may be acquired. For example, the image of the treatment space acquired by the substrate type sensor WS may include the substrate "W" and the ring member "R" such that an interval between the ring member "R" and the substrate "W" may be identified. Accordingly, the operator may identify, through the substrate type sensor WS, whether the ring member "R" is properly seated such that the interval between the ring member "R" and the substrate "W" maintains a preset interval "G" as illustrated in FIG. 10, or whether the ring member "R" is improperly seated such that the interval between the ring member "R" and the substrate "W" maintains a first interval G1 or a second interval G2 that is different from the preset interval. Furthermore, the images acquired by the substrate type sensor WS may be delivered to the controller 700. Furthermore, the controller 700 may derive data values for the interval between the ring member "R" and the substrate "W" by analyzing the images. Furthermore, the controller 700 may store the data values. Furthermore, the controller 700 may perform an automatic teaching operation for the first transfer robot 150 and the second transfer robot 350 through the data values.

In this way, to increase a precision of the image acquired by the substrate type sensor WS or increase a precision of an automatic teaching operation for the first transfer robot 150 and the second transfer robot 350, it is important to precisely secure centering of the substrate type sensor WS. Accordingly, the substrate treating apparatus 1000 according to the embodiment of the inventive concept includes the alignment unit 600 provided in the index chamber 130.

Figure 12:
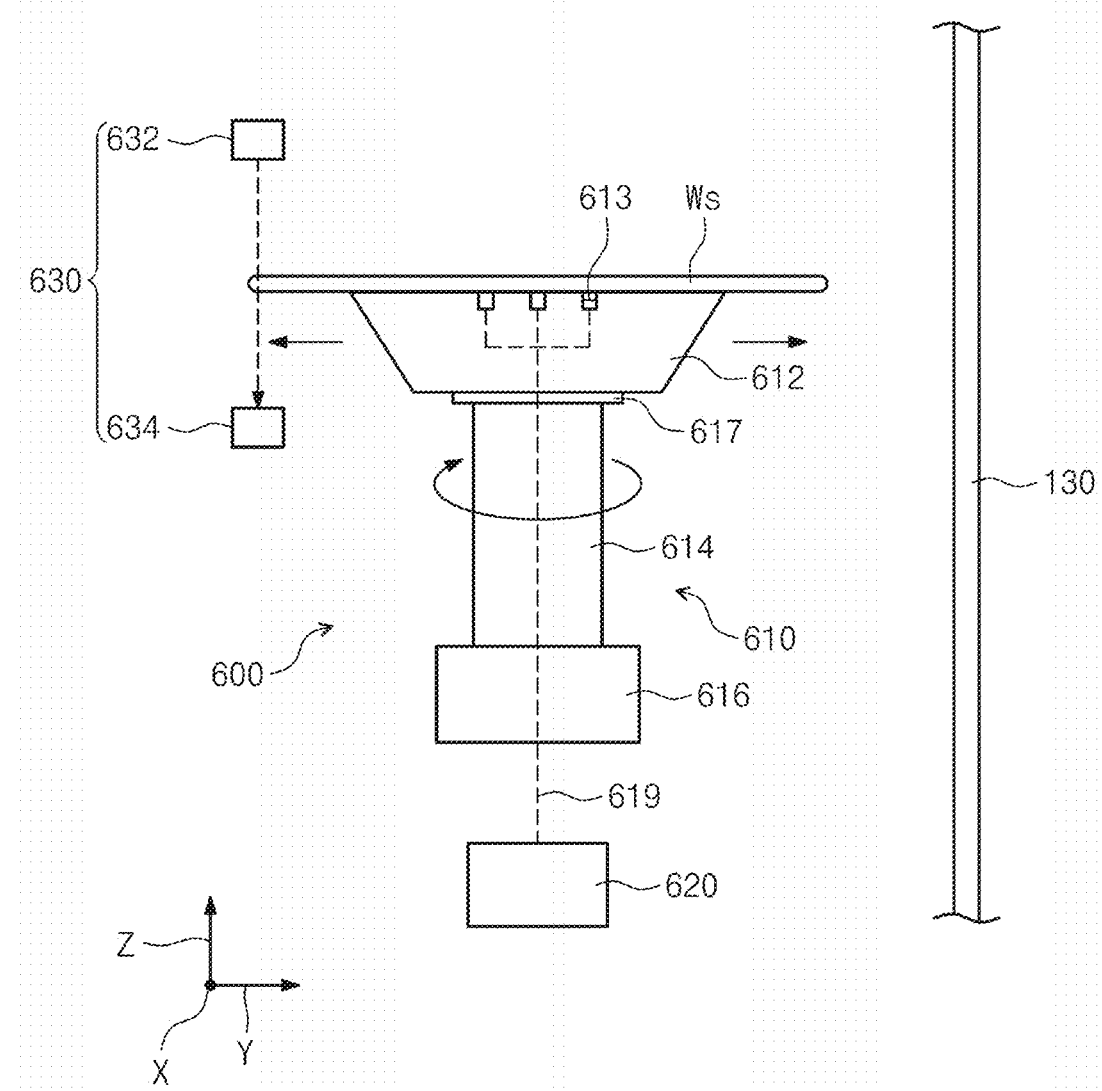
FIG. 12 is a view illustrating an alignment unit of FIG. 1.
Figure 13:
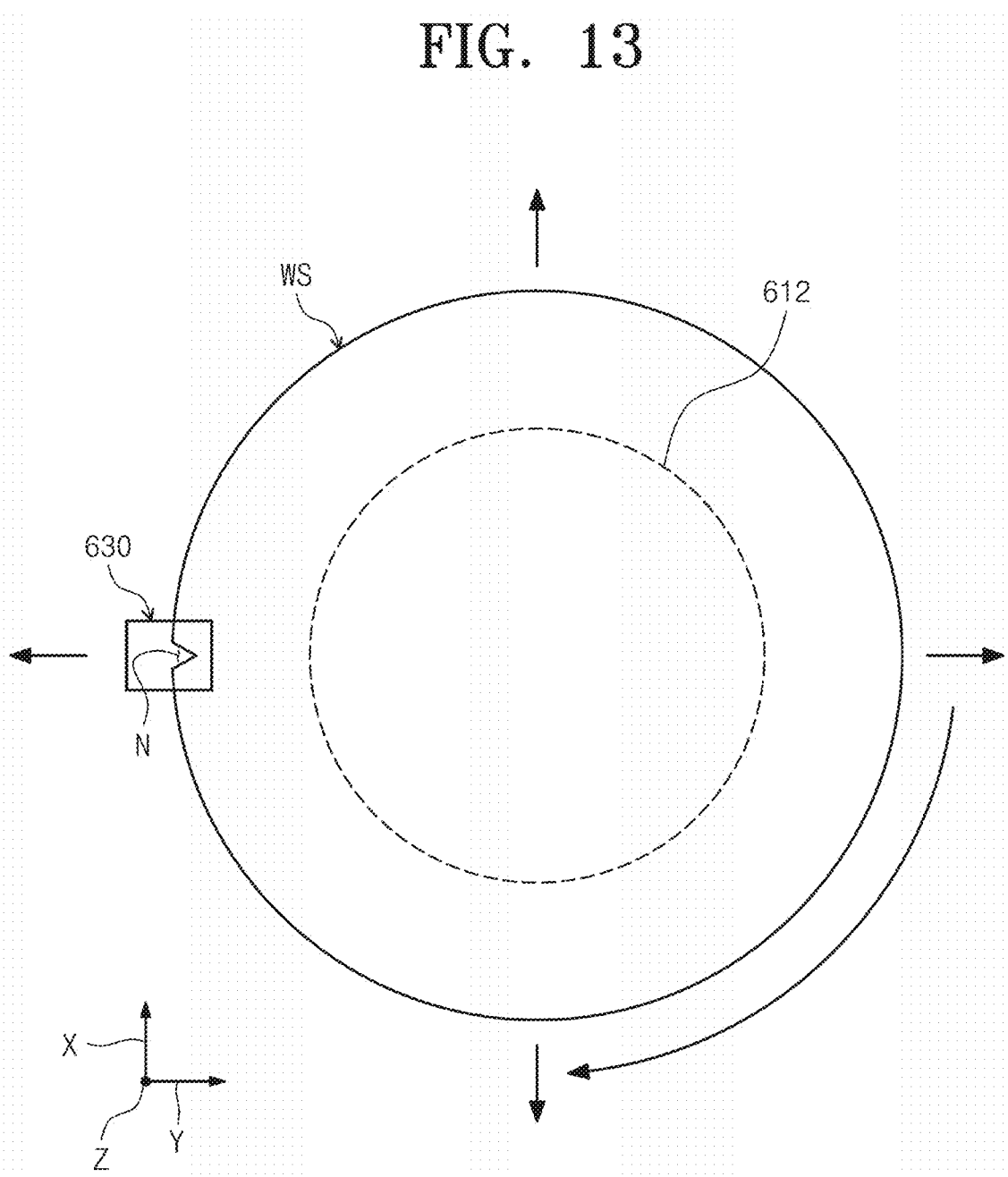
FIG. 13 is a view an alignment unit of FIG. 12, when viewed from a top.

FIG. 12 is a view illustrating an alignment unit of FIG. 1. FIG. 13 is a view an alignment unit of FIG. 12, when viewed from a top. Referring to FIGS. 12 and 13, the alignment unit 600 according to the embodiment of the inventive concept may align the substrate type sensor WS. However, the inventive concept is not limited thereto, and the alignment unit 600 also may align the substrate "W". The alignment unit 600 may include a support member 610, a pressure reducing member 620, and a sensor member 630.

The support member 610 may support the substrate type sensor WS in the index chamber 130. The support member 610 may rotate the substrate type sensor WS. The support member 610 may change a location of the substrate type sensor WS along the first direction "X" and/or the second direction "Y" when viewed from the top. Furthermore, the support member 610 may change a height of the substrate type sensor WS supported by the support member 610.

The support member 610 may include a support plate 612, a rotary shaft 614, a driver 616, and a positioning part 617. The support plate 612 may have a support surface that supports the substrate type sensor WS. Furthermore, the support plate 612 may have a suction hole 613 that vacuum-suctions the substrate type sensor WS. Furthermore, a pressure reducing line 619 may be connected to the suction hole 613. Furthermore, the pressure reducing line 619 may be connected to the pressure reducing member 620. That is, the suction hole 613 may be connected to the pressure reducing member 620 that reduces a pressure in the suction hole 613 by a medium of the pressure reducing line 619. Furthermore, the pressure reducing member 620 may be a pump. However, the inventive concept is not limited thereto, and the pressure reducing member 620 may be modified by using known apparatuses that may reduce a pressure in the suction hole.

The rotary shaft 614 that rotates the support plate 612 may be provided at a lower portion of the support plate 612. The rotary shaft 614 may be a hollow shaft. Furthermore, the rotary shaft 614 may be rotated by the driver 616 that may be a hollow motor. That is, the driver 616 may generate driving power that rotates the support plate 612.

The positioning part 617 may change a location of the support plate 612. For example, the positioning part 617 may change the location of the support plate 612 to the first direction "X" and/or the second direction "Y". Accordingly, the positioning part 617 moves the substrate type sensor WS supported by the support plate 612 to the first direction "X" and/or the second direction "Y". The positioning part 617 may be provided between the support plate 612 and the rotary shaft 614. The positioning part 617 may include an LM guide. The substrate type sensor WS may have a diameter that is somewhat larger than the substrate "W".

The sensor member 630 may sense whether the notch "N" formed in the substrate type sensor WS is aligned. The sensor member 630 may sense the notch "N" formed in the substrate type sensor WS. The sensor member 630 may include an irradiation part 632 that irradiates light, and a light receiving part 634 that receives the light irradiated by the irradiation part 632. The light irradiated by the irradiation part 632 may have straightness. For example, the light irradiated by the irradiation part 632 may be a laser beam. The sensor member 630 may determine whether the light is received by the light receiving part 634, and whether the notch "N" of the substrate type sensor WS is properly arranged according to an amount of the received light.

The controller 700 may align the substrate type sensor WS by controlling the alignment unit 600. For example, the controller 700 may control the alignment unit 600 such that the notch "N" of the substrate type sensor WS supported by the support plate 612 is located between the irradiation part 632 and the light receiving part 634, by rotating the support plate 612 or moving the location of the support plate 612 in the first direction "X" and/or the second direction "Y".

Figure 14:
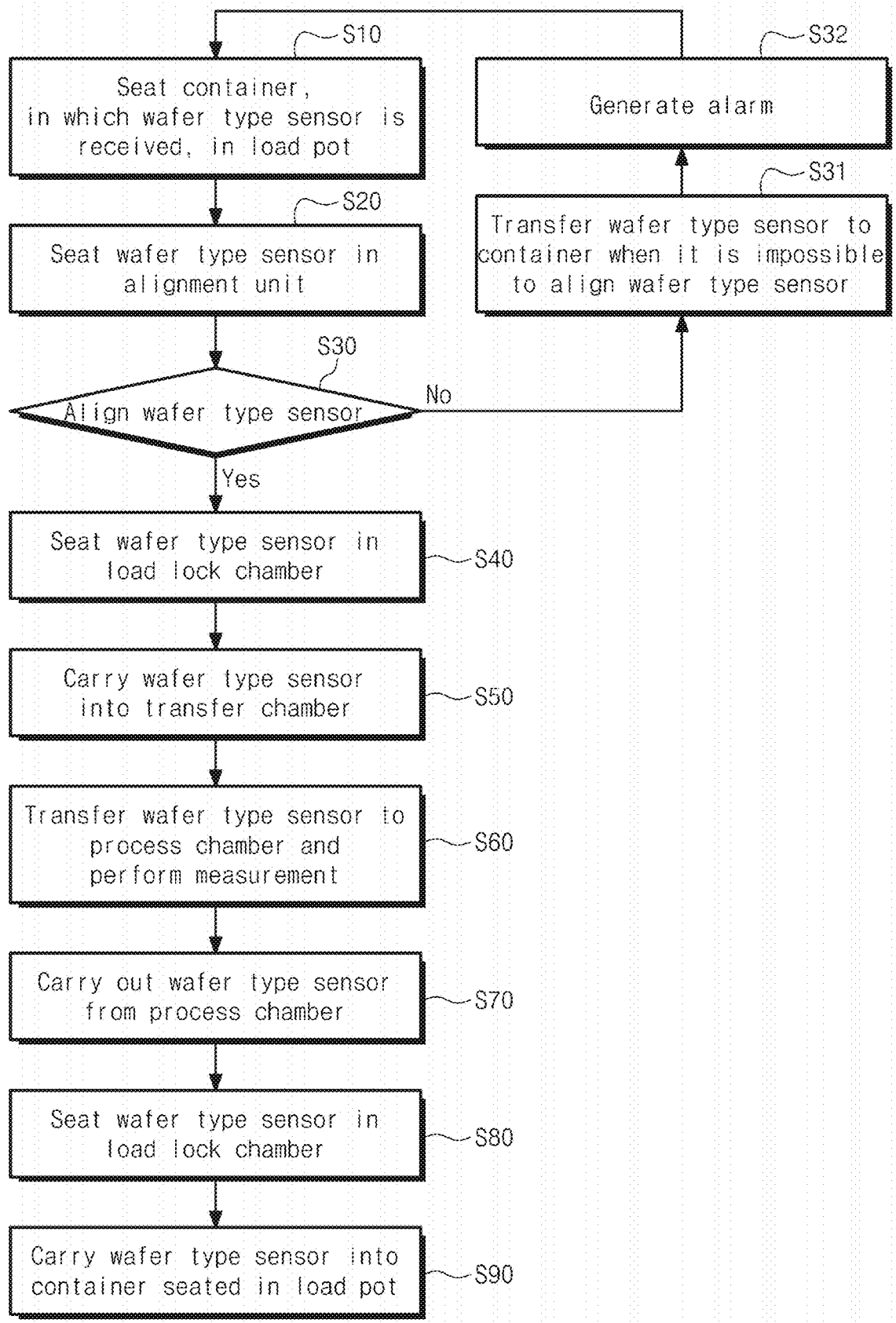
FIG. 14 is a flowchart illustrating a transfer sequence of a substrate type sensor according to an embodiment of the inventive concept.
Figure 15:
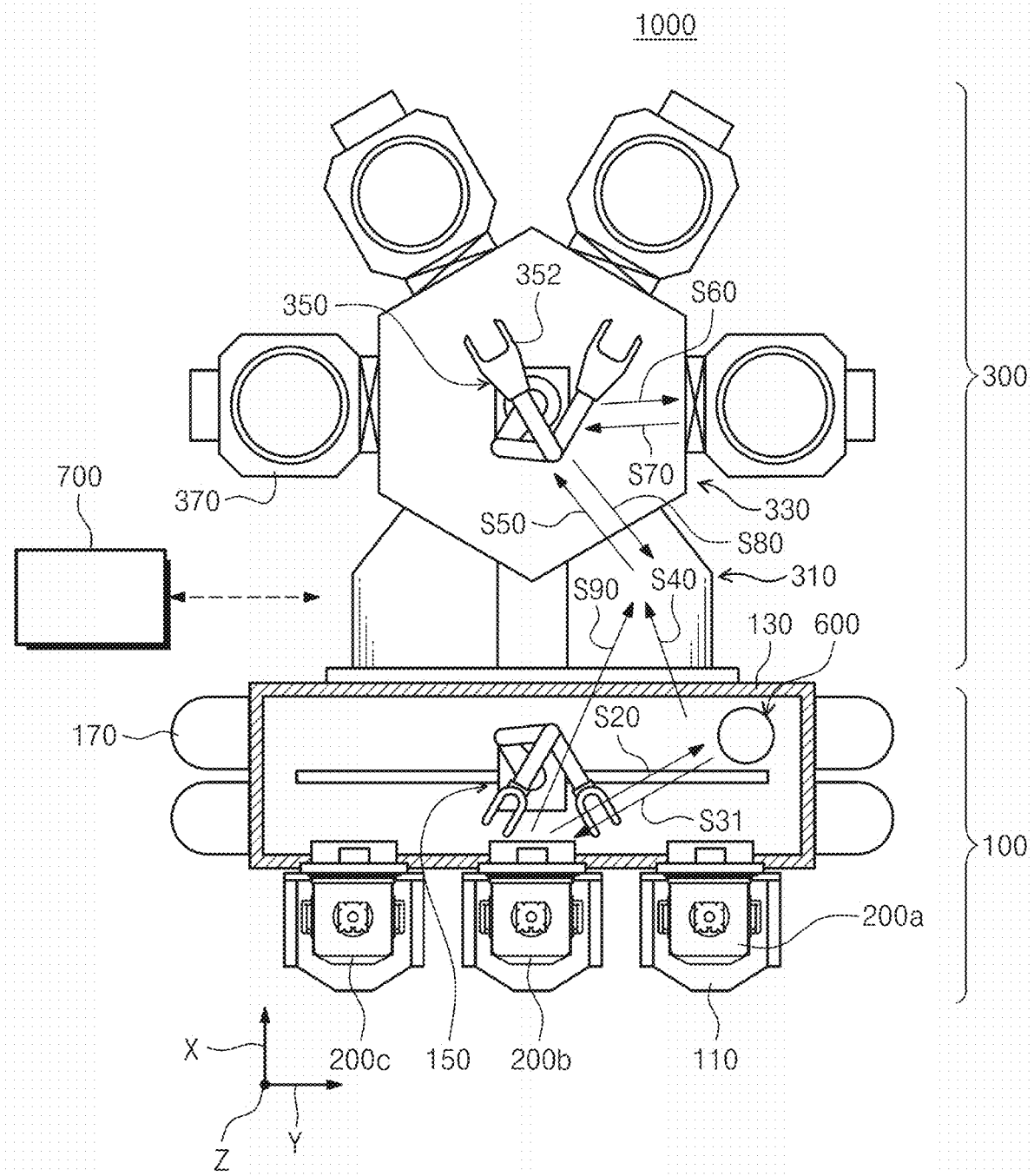
FIG. 15 is a view schematically illustrating a state, in which a substrate treating apparatus according to an embodiment of the inventive concept transfers a substrate type sensor.

FIG. 14 is a flowchart illustrating a transfer sequence of a substrate type sensor according to an embodiment of the inventive concept. FIG. 15 is a view schematically illustrating a state, in which a substrate treating apparatus according to an embodiment of the inventive concept transfers a substrate type sensor. Referring to FIGS. 14 and 15, a transfer sequence of the substrate type sensor WS will be described in detail. To perform the transfer sequence of the substrate type sensor WS, which will be described below, the controller 700 may control the substrate treating apparatus 1000.

First, the second container 200b, in which the substrate type sensor WS is received, may be seated in the load pot 110 of the index unit 100 (S10). Then, the second container 200b may be transferred by an article transfer apparatus, for example, an OHT.

Thereafter, the first transfer robot 150 may carry out the substrate type sensor WS from the second container 200b, and may seat the substrate type sensor WS on the support plate 612 included in the alignment unit 600 (S20).

Thereafter, the alignment unit 600 may align the substrate type sensor WS. Then, the support plate 612 of the alignment unit 600 may be rotated. Furthermore, the location of the support plate 612 of the alignment unit 600 may be changed along the first direction "X", the second direction "Y", and/or the third direction "Z". Accordingly, the notch "N" formed in the substrate type sensor WS may be aligned to be located between the irradiation part 632 and the light receiving part 634 of the sensor member 630.

Then, there may be a case, in which the alignment unit 600 has completely aligned the substrate type sensor WS, and a case, in which it is impossible for the alignment unit 600 to align the substrate type sensor WS.

First, when the alignment unit 600 has completely aligned the substrate type sensor WS, the first transfer robot 150 raises the substrate type sensor WS from the support plate 612 of the alignment unit 600 and seats the substrate type sensor WS in the load lock chamber 310 (S40).

Thereafter, an internal atmosphere of the load lock chamber 310 is converted from an atmospheric atmosphere to a vacuum atmosphere, and when the internal atmosphere of the load lock chamber 310 is converted to the vacuum atmosphere, the second transfer robot 350 may carry out the substrate type sensor WS from the load lock chamber 310 to the transfer chamber 330 (S50).

Thereafter, the second transfer robot 350 may transfer the substrate type sensor WS to the treatment space of the process chamber 510 included in the process chamber 370, and the substrate type sensor WS may perform a measurement, for example, to acquire an image from the treatment space of the process chamber 510 (S60).

Thereafter, the second transfer robot 350 may carry out the substrate type sensor WS from the treatment space of the process chamber 510 included in the process chamber 370 (S70).

Thereafter, the second transfer robot 350 ma seat the substrate type sensor WS in the load lock chamber 310 (S80).

Thereafter, an internal atmosphere of the load lock chamber 310 is converted from a vacuum atmosphere to an atmospheric atmosphere, and when the internal atmosphere of the load lock chamber 310 is converted to the vacuum atmosphere, the first transfer robot 150 may carry out the substrate type sensor WS from the load lock chamber 310 and carry the substrate type sensor WS into the second container 200*b* seated in the load pot 110 (S90).

When it is impossible for the alignment unit 600 to align the substrate type sensor WS, the first transfer robot 150 may transfer the substrate type sensor WS seated on the support plate 612 of the alignment unit 600 to the second container 200*b* again (S31). As an example of not being able to align the substrate type sensor WS, a shape of the substrate type sensor WS itself may be defective or the substrate type sensor WS may be deflected. The controller 700 may determine that it is impossible for the alignment unit 600 to align the substrate type sensor WS when the gas flows in the pressure reducing line 619 connected to the suction hole 613 for a preset period of time, and may control the first transfer robot 150 to transfer the substrate type sensor WS from the alignment unit 600 to the second container 200*b*. When the gas flows in the pressure reducing line 619 for the preset period of time or more, it may be inferred that the substrate type sensor WS is not fixedly suctioned to the support plate 612 and the substrate type sensor WS is deflected. Furthermore, when the sensor member 630 does not sense the notch "N" formed in the substrate type sensor WS even though the substrate type sensor WS is rotated by a preset angle or more (for example, 360 degrees or more), the controller 700 may determine that it is impossible for the alignment unit 600 to align the substrate type sensor WS, and may control the first transfer robot 150 to transfer the substrate type sensor WS from the alignment unit 600 to the second container 200*b*. This is because it may be inferred that the substrate type sensor WS is deflected when the sensor member 630 does not sense the notch "N" formed in the substrate type sensor WS even though the substrate type sensor WS is rotated for the preset angle or more (for example, 360 degrees or more).

Thereafter, the controller 700 may generate an alarm such that the operator may recognize that it is impossible for the alignment unit 600 to align the substrate type sensor WS (S32). The alarm may be implemented by various schemes (for example, a sound or the like) that allows the operator to recognize that it is impossible for the alignment unit 600 to align the substrate type sensor WS.

According to the embodiment of the inventive concept, the substrate treating apparatus 1000 of the inventive concept may align the substrate type sensor WS and transfer the substrate type sensor WS to the treatment space of the process chamber 510 even though the containers 200*a*, 200*b*, and 200*c* do not provide a structure for aligning the substrate type sensor WS due to the presence of the alignment unit 600. Furthermore, according to the embodiment of the inventive concept, the alignment unit 600 is provided in the index chamber 130 included in the index unit 100. Accordingly, the substrate type sensor WS is delivered to the process executing unit 300 while being aligned. Accordingly, a problem that may be caused as the substrate type sensor WS may be transferred to the process executing unit 300 while not being aligned (for example, a problem of the substrate type sensor WS falling or colliding the configurations of the substrate treating apparatus 1000) may be solved. Furthermore, according to the embodiment of the inventive concept, the substrate type sensor WS is transferred to the second container 200*b* when it is determined that it is impossible for the alignment unit 600 to align the substrate type sensor WS. The substrate type sensor WS may be transferred to the process executing unit 300 while not being aligned when the alignment unit 600 performs only a programmed predetermined operation, and according to the inventive concept, the substrate type sensor WS may be prevented from entering the process executing unit 300 while not being aligned by transferring the substrate type sensor WS to the second container 200*b*, when it is determined that it is impossible for the alignment unit 600 to align the substrate type sensor WS. Furthermore, because the alignment unit 600 is provided in the index chamber 130, the transfer sequence may be further simplified.

An embodiment of the inventive concept provides a substrate treating apparatus that may efficiently align a substrate type sensor.

Furthermore, according to the embodiment of the inventive concept, an image for an interior of the process chamber may be effectively acquired.

Furthermore, according to the embodiment of the inventive concept, auto teaching for the transfer robot may be effectively performed.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
an index unit including a load pot, in which a container is seated, and an index chamber connected to the load pot;
a process executing unit having a load lock chamber connected to the index chamber and a process chamber configured to treat a substrate transferred to the load lock chamber; and
a controller,
wherein the index unit further includes an alignment unit provided in the index chamber and configured to align a substrate type sensor transferred to the process chamber,
wherein the alignment unit includes,
a support member including a support plate and configured to support the substrate type sensor, and
a sensor member configured to sense whether a notch defined in the substrate type sensor is aligned, wherein the index unit further includes a first transfer robot provided in the index chamber and configured to carry out the substrate type sensor from the container, and wherein the controller is configured to,
control the first transfer robot to carry out the substrate type sensor from the container and seat the substrate type sensor on the support plate,
control the first transfer robot and the alignment unit to align the substrate type sensor, and
control the first transfer robot to transfer the substrate type sensor seated on the support plate to the container when the alignment unit is unable to align a location of the notch.

2. The substrate treating apparatus of claim 1, wherein the support member includes:
a positioning part configured to move the substrate type sensor supported by the support member in a first direction and/or a second direction that is perpendicular to the first direction when viewed from a top;
the support plate having a support surface that is configured to support the substrate type sensor; and
a rotary shaft configured to rotate the support plate.

3. The substrate treating apparatus of claim 2, wherein the support plate has a suction hole that is configured to vacuum-suction the substrate type sensor supported by the support surface.

4. The substrate treating apparatus of claim 3, wherein the alignment unit further includes:
a pressure reducing member configured to reduce a pressure in the suction hole.

5. The substrate treating apparatus of claim 3, wherein the controller is configured to:
determine that the alignment unit is unable to align the substrate type sensor when a gas flows in a pressure reducing line connected to the suction hole for a period of time or more.

6. The substrate treating apparatus of claim 1, wherein the sensor member includes:
an irradiation part configured to irradiate light; and
a light receiving part configured to receive the light irradiated by the irradiation part.

7. The substrate treating apparatus of claim 1, wherein the controller is configured to:
when the alignment unit has completely aligned the substrate type sensor, control the first transfer robot to transfer the substrate type sensor to the load lock chamber.

8. The substrate treating apparatus of claim 1, wherein the controller is configured to:
when the alignment unit is unable to align the substrate type sensor, control the first transfer robot to transfer the substrate type sensor seated on the support plate to the container.

9. The substrate treating apparatus of claim 8, wherein the controller is configured to:
determine that the alignment unit is unable to align the substrate type sensor when the sensor member does not sense the notch even though the substrate type sensor is rotated by an angle or more.

10. A substrate treating apparatus comprising:
a process chamber having a treatment space for treating a substrate;
an index chamber connected to a load pot, in which a container in which a substrate type sensor that acquires an image of the treatment space is received is seated, and configured to maintain an interior atmosphere at an atmospheric atmosphere;
at least one transfer robot configured to transfer the substrate or the substrate type sensor between the index chamber and the process chamber;
an alignment unit provided in the index chamber and configured to align the substrate type sensor; and
a controller configured to control the transfer robot to transfer the substrate type sensor to the container when the alignment unit is unable to align a location of a notch defined in the substrate type sensor.

11. The substrate treating apparatus of claim 10, wherein the controller is further configured to:
carry out the substrate type sensor from the container and transfer the substrate type sensor to the alignment unit; and
control the transfer robot and the alignment unit such that the alignment unit aligns the location of the notch.

12. The substrate treating apparatus of claim 10, wherein the controller is further configured to:
when the alignment unit has completely aligned the location of the notch, control the transfer robot to transfer the substrate type sensor to the process chamber.

13. The substrate treating apparatus of claim 10, wherein the controller is further configured to:
determine that the alignment unit is unable to align the location of the notch when a gas flows in a pressure reducing line connected to a suction hole included in the alignment unit and configured to vacuum-suction the substrate type sensor for a period of time or more.

14. The substrate treating apparatus of claim 10, wherein the controller is further configured to:
determine that the alignment unit is unable to align the location of the notch when a sensor member included in the alignment unit and configured to sense the notch does not sense the notch even through the alignment unit rotates the substrate type sensor by an angle or more.

15. A substrate treating apparatus comprising:
an index unit including a load pot in which a container in which a substrate and a substrate type sensor having an image acquiring module are received is seated;
a process executing unit having a process chamber that treats the substrate; and
a controller,
wherein the index unit includes,
an index chamber connected to the load pot and maintained at an atmospheric atmosphere,
an alignment unit provided in the index chamber and configured to align the substrate type sensor, and
a first transfer robot configured to transfer the substrate or the substrate type sensor between the index chamber and the process executing unit, wherein the process executing unit includes,
a load lock chamber configured to contact the index chamber and an internal atmosphere of which is converted between a vacuum pressure atmosphere and the atmospheric atmosphere,
a transfer chamber configured to contact the load pot and an internal atmosphere of which is maintained in the vacuum pressure atmosphere, and
a second transfer robot provided in the transfer chamber, and configured to transfer the substrate carried into the load pot or the substrate type sensor to the process chamber, wherein the alignment unit includes,
- a support plate having a support surface that supports the substrate type sensor, and having a suction hole for vacuum-absorbing the substrate type sensor supported on the support surface,
- a rotary shaft configured to rotate the support plate,
- a positioning part configured to move the substrate type sensor supported by the support plate in a first direction and/or a second direction that is perpendicular to the first direction when viewed from a top,
- an irradiation part configured to irradiate light, and
- a sensor member configured to receive the light irradiated by the irradiation part and sense a notch defined in the substrate type sensor, and wherein the controller is configured to,
- control the first transfer robot to carry out the substrate type sensor from the container and seat the substrate type sensor on the support plate,
- control the alignment unit to align the substrate type sensor by changing a location of the support plate and/or rotating the support plate,
- when the alignment unit has aligned the substrate type sensor, control the first transfer robot to transfer the substrate type sensor to the load lock chamber,
- when the alignment unit is unable to align the substrate type sensor, control the first transfer robot to transfer the substrate type sensor seated on the support plate to the container, and
- when a gas flows in a pressure reducing line connected to the suction hole for a period of time or more or the sensor member does not sense the notch even though the substrate type sensor is rotated by an angle or more, determine that the alignment unit is unable to align the substrate type sensor.

* * * * *